United States Patent
Tsang et al.

(10) Patent No.: US 6,940,759 B2
(45) Date of Patent: Sep. 6, 2005

(54) GROUP ERASING SYSTEM FOR FLASH ARRAY WITH MULTIPLE SECTORS

(75) Inventors: Sai K. Tsang, Union City, CA (US); Steven J. Schumann, Sunnyvale, CA (US); Fai Ching, Fremont, CA (US)

(73) Assignee: Atmel Corporation, San Jose, CA (US)

( * ) Notice: Subject to any disclaimer, the term of this patent is extended or adjusted under 35 U.S.C. 154(b) by 76 days.

(21) Appl. No.: 10/685,957

(22) Filed: Oct. 14, 2003

(65) Prior Publication Data

US 2005/0078528 A1 Apr. 14, 2005

(51) Int. Cl.$^7$ ............................................... G11C 16/00
(52) U.S. Cl. ............................. 365/185.29; 365/185.11; 365/185.23
(58) Field of Search ....................... 365/185.29, 185.11, 365/185.23

(56) References Cited

U.S. PATENT DOCUMENTS

| | | | |
|---|---|---|---|
| 5,920,501 A | * | 7/1999 | Norman ................. 365/185.02 |
| 6,118,705 A | * | 9/2000 | Gupta et al. ............ 365/185.29 |
| 6,735,126 B1 | * | 5/2004 | Nakagawa ............. 365/185.29 |
| 6,768,671 B1 | * | 7/2004 | Lee et al. .............. 365/185.02 |

* cited by examiner

Primary Examiner—Tan T. Nguyen
(74) Attorney, Agent, or Firm—Schneck & Schneck; Thomas Schneck

(57) ABSTRACT

A decoding system for multi-plane memories routes address information corresponding to distinct memory access operations to the designated planes. The system includes an array of functional registers dedicated to random access read, burst read, program, erase, and erase-suspend program operations. Plane selector blocks for each plane receive the address outputs from all of the registers and plane function select logic controls the routing in accord with memory access commands for specified planes. Simultaneous operations of different type in different planes and nested operations in the same plane are possible.

6 Claims, 5 Drawing Sheets

GROUP ERASING SYSTEM FOR FLASH ARRAY WITH MULTIPLE SECTORS

TECHNICAL FIELD

The present invention relates to the design and operation of erasable and programmable non-volatile memory devices. In particular, the present invention relates to circuits and algorithms for erasing memory cells in Flash memory.

BACKGROUND ART

A typical non-volatile memory cell consists of a source, a channel and a drain with a floating gate over the channel and a control gate over the floating gate. A wordline connected to the control gates of a plurality of memory cells provides the voltage necessary for the programming, reading, and erasure of the memory cells. During a programming step, the floating gate is charged with electrons, which increases the turn-on threshold voltage of the memory cell (i.e., it will remain non-conductive even when a read voltage, which is typically 5V, is applied to its control gate.) During an erasure step, electrons are removed from the floating gate to lower the threshold voltage. With a lower threshold voltage, the memory cell can be turned on to a conductive state when a read voltage is applied to the control gate.

A flash memory cell array is typically divided up into sectors and the erasure of the memory cell array is typically carried out by erasing one sector at a time. To erase a sector, a positive voltage is applied to the sources of all memory cells in the sector and a negative voltage is applied to all control gates through the wordlines. Because of the large number of cells in a sector, the band-to-band tunneling current is high. Therefore, this method of erasure requires a powerful voltage pump to provide the high voltage at the source. However, such a powerful voltage pump requires accompanying powerful circuitry that takes up substantial valuable chip space. Therefore, it would be desirable to have a flash memory design that does not require the use of such a powerful voltage pump.

In addition, flash memory cells sometimes suffer from the problem of over-erasure. Over-erasure occurs when, during the erasing step, too many electrons are removed from the floating gate, leaving a slightly positive charge that causes the memory cell to remain slightly turned-on even without any assertive voltage at its control gate. As a result, a small current may leak through the memory cell even when it is not addressed. A number of over-erased cells along a given bitline can cause an accumulation of leakage current that is sufficient to cause a false reading. Also, when the memory cells are over-erased, it is difficult to reprogram the cells successfully using hot electron programming. Over-erasure can be reduced by having a tight erase threshold voltage and having an even cell current distribution. However, due to the fact that the voltage supply has to be distributed to all memory cells in the sector during the erasure step, sometimes including the defective cells, a consistent erase threshold voltage and an even cell current is very difficult to achieve. Therefore, it would be desirable to reduce the number of over-erased memory cells by having a flash memory design that provides a tighter erase threshold voltage and a more even cell current distribution.

Moreover, if there is a defective row that has a path to ground, it will prevent the gate voltage from going negative, thereby rendering the whole sector inerasable. One current solution for this problem is to provide a redundant sector that will replace the deflective sector. However, a sector is a big block of memory cells and having multiple redundant replacement sectors would take up valuable chip space. It would be desirable to have a flash memory design that would allow the replacement of defective rows of memory cells with redundant rows of memory cells, thereby eliminating the need for the bulking redundant sectors.

DISCLOSURE OF THE INVENTION

The present invention corrects all of the inefficiency related to the erasure of multi-sector flash memory array described above by subdividing each sector into groups of wordlines and performs the erasure of the sector one group at a time instead of a whole sector at a time. The present invention provides a flash memory device that comprises a memory cell array with a plurality of memory cells that are organized in a hierarchical format: the memory cell array is being made up of a plurality of sectors, each sector is made up of a plurality of groups, and each group is made up of a plurality of wordlines that provide a plurality of voltages to the control gates of a plurality of memory cells for the purpose of reading, programming, and erasing the memory cells. The erasure of the memory array is carried out by erasing groups of wordline individually and independently.

The sectors, groups, and wordlines are identified by a different part of the x-addresses: the sectors are identified by the upper part of the x-address, the groups are identified by the middle part of the x-address, while the wordlines are identified by the lower part of the x-address. The wordlines in each group is connected to a wordline voltage modulator that issues a plurality of voltages for the purpose of programming, reading, or erasing memory cells through a group wordline driver. The group wordline driver connects the wordlines in the group to the wordline voltage modulator when the group is selected for erasure. Otherwise, it disconnects the wordlines from the wordline voltage modulator and connects them to ground instead, thereby isolating the unselected wordlines from the voltage source. Consequently, there is no need to have powerful voltage pump because the voltage source only supplies voltages to a limited number of memory cells. With the smaller number of erasure cells, a much tighter erase threshold voltage and better cell current distribution is possible, thereby reducing the number of over-erased cells.

Each wordline in a group connects to the wordline voltage modulator through a pull-up transistor inside the wordline group driver. Each wordline is also connected to a common ground through a pull-down transistor inside the wordline group driver. A switching means connected to the gates of the pull-up and pull-down transistors determines whether the wordlines in a group connects to the wordline voltage modulator or common ground. This wordline driving mechanism enables the division of the wordline in groups. The group selected to be erased has all its wordlines connected to the wordline voltage modulator through the drains of the pull-up transistors in the wordline group driver. All the voltages needed, be it negative voltage or 0V, for the wordlines in the erasing process are provided by the wordline voltage modulator. Those groups of wordlines that are not selected to be erased have all of their wordlines isolated from the modulator by the disabled pull-up transistors in the corresponding wordline group drivers. At the same time, an assertive voltage at the gates of the pull-down transistors connects the wordlines to ground. This system blocks the negative voltage output of the wordline voltage modulator from going into the defected wordlines and it ensures a healthy negative voltage for all the good wordlines in the group.

The erasure goes as follow: the erasure of the memory array begins with a pre-erase routine wherein each wordline is scanned for defective memory cell and the addresses loaded into defective wordline erase register. During the erasure cycle, the register would output a logic 1 to indicate a defective wordline and a logic 0 to indicated a good wordline. The outputs of the register are feed into the wordline voltage modulator and it dictates what voltages should be sent to the drain of the pull-up transistors in the wordline group driver. The defective wordlines are grounded by the wordline voltage modulator while a negative voltage is sent to the good wordlines. In this way, the defective wordlines are isolated from the negative voltage source, thereby preventing the deterioration of the negative erasure voltage.

MODES FOR CARRYING OUT THE INVENTION

Figure 1:
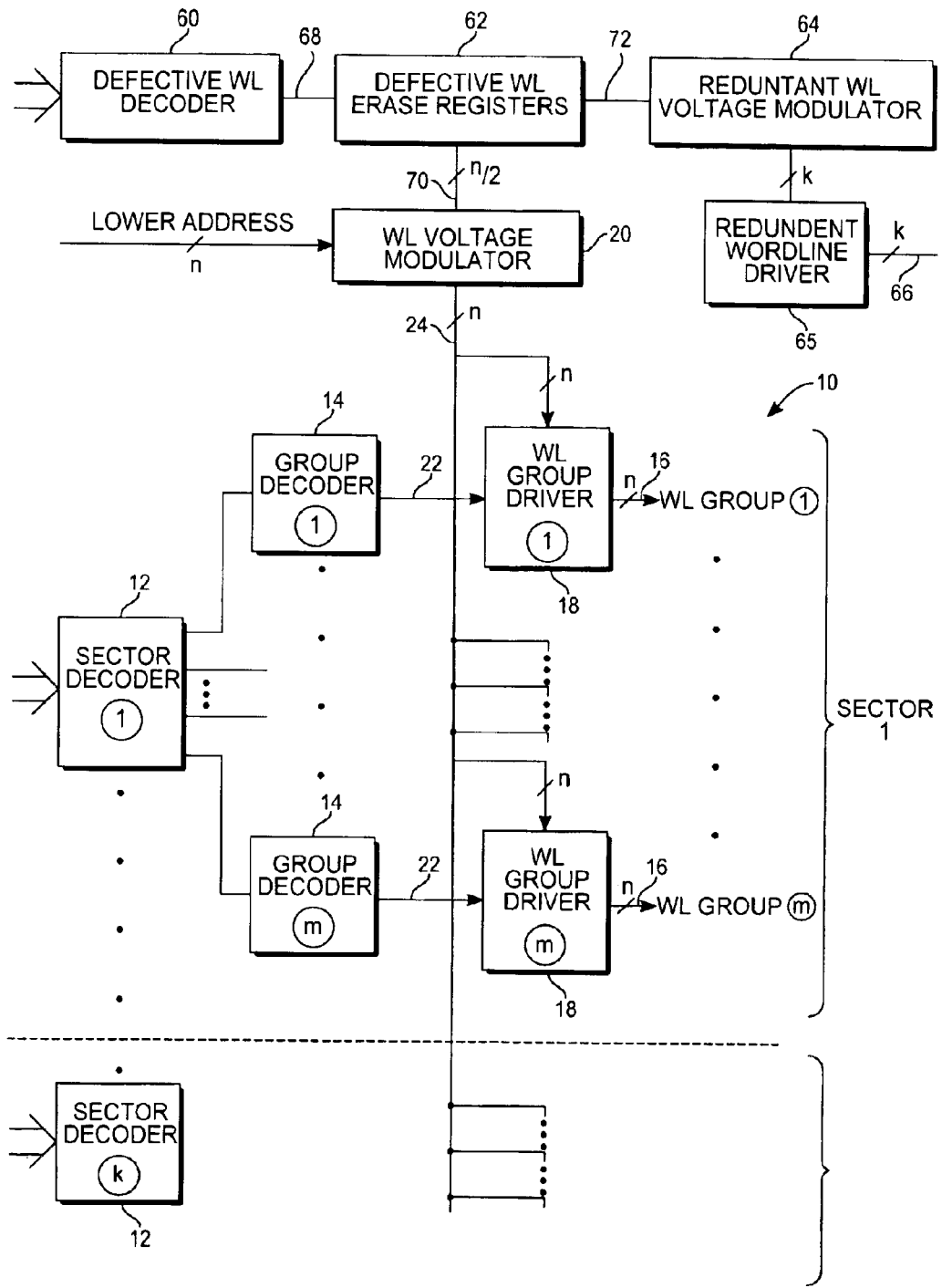
FIG. 1 is a block diagram of a flash memory cell array of the present invention.

FIG. 1 shows the hierarchical structure of the memory array of the present invention. As shown in FIG. 1, the memory array 10 is made up of sectors 1 through k, each of which is identified by a sector decoder 12. Each sector is made up of m groups, each of which is identified by a group decoder 14. Each group is made up of n wordlines 16, each of which connects to a wordline group driver 18 that connects the wordlines in the group to a wordline voltage modulator 20 whenever the group of wordlines 16 is selected as indicated by an assertive signal 22 from the group decoder 14. Absent such an assertive signal 22 from the group decoder 14, the wordline group driver 18 connects the wordlines in the group to ground, thereby isolating all wordlines in the group 16 from the wordline voltage modulator 20.

The wordline voltage modulator 20 is responsible for sending out an appropriate voltage for proper reading, programming, or erasure of the selected wordlines. For instance, during a read step, the output of the wordline voltage modulator 20 is typically 5V. During a programming step, the output of the wordline voltage modulator 20 is typically 10V. During an erasure step, the output of the wordline voltage modulator 20 is typically −12V. The wordline voltage modulator 20 has the same number of output lines 24 as the number of wordlines in a group and these output lines 24 feed into an input terminal of every wordline group driver 18 in the memory array 10. During an erasure step, only one assertive signal 22 is generated throughout the memory array, which means that only one of the wordline group 16 is connected to the wordline voltage modulator 20 at any one time while all other wordlines are isolated from the wordline modulator 20.

Figure 2:
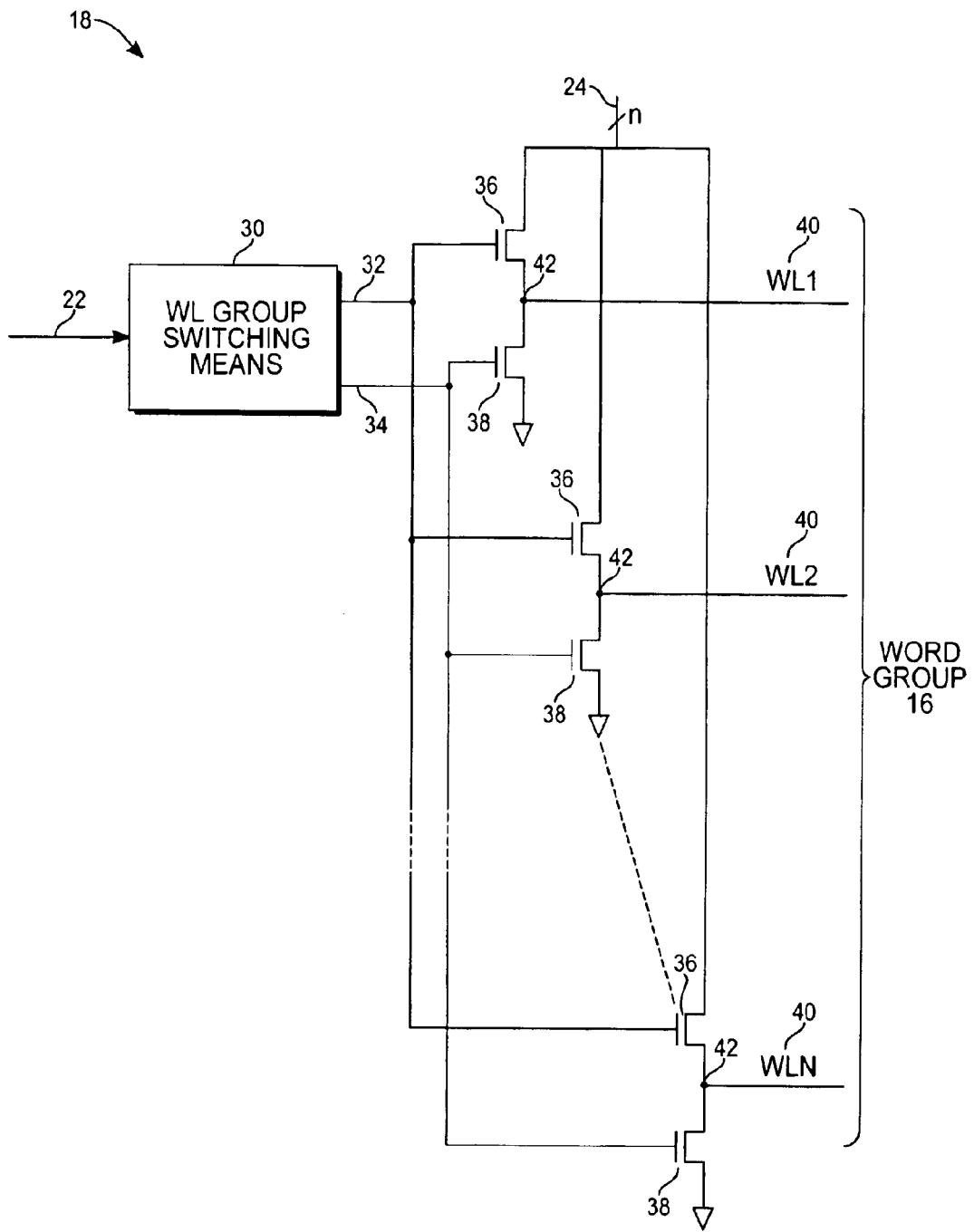
FIG. 2 is a block diagram of a wordline driver of the present invention shown in FIG. 1.

FIG. 2 shows an embodiment of a wordline group driver 18. The wordline group driver 18 includes a wordline group switching means 30 that has an input terminal 22 that takes an input signal from the group decoder 14 (FIG. 1) and issues a first output signal to a first output line 32 that is connected to the gates of a first set of NMOS transistors 36 that functions as pull-up transistors and a second output signal to a second output line 34 that is connected to the gates of a second set of NMOS transistors 38 that functions as pull-down transistors. The source of each NMOS transistor from the first set of NMOS transistors 36 connects to the drain of an NMOS transistor from the second set of NMOS transistors 38 at a common node 42 to form a transistor pair. The drains of NMOS transistors in the first set 36 being connected to the wordline voltage modulator 20 (FIG. 1) through output lines 24 while the sources of the second set of NMOS transistors 38 being connected to a common ground. A wordline 40 connects to each common node 42 whereby signals presented at the gates of the first and second sets of NMOS transistors 36, 38 determine whether the wordlines 40 are connected to the output lines 24 of the wordline voltage modulator 20 or to the common ground. The passing all voltages through the pull-up transistors only allows the present invention to divide the wordlines into groups for erasure.

During erasure, the wordline group switching means behaves as follow: an assertive signal at the input terminal 22 would cause to wordline group switching means 30 to output an assertive voltage signal at the first output line 32 and a non-assertive voltage signal at the second output line 34. Lacking an assertive signal at the input terminal 22, the wordline group switching means issues a non-assertive voltage signal to the first output line 32 and a assertive voltage signal to the second output line 34. Consequently, an assertive signal at the input terminal 22 of the wordline group switching means 30 connects each wordline 40 to one of the output lines 24 of the wordline voltage modulator 20. Lacking such an assertive signal at the input terminal 22 of the wordline group switching means 30, the wordlines 40 in the group are electrically isolated from the output lines 24 of the wordline voltage modulator 20 and are connected to the common ground instead. With only one assertive signal being presented at the input terminal 22 of the wordline group driver 18 at any one time, only one group of wordlines is being connected to the output lines 24 of the wordline voltage modulator 20 at any one time.

Figure 3:
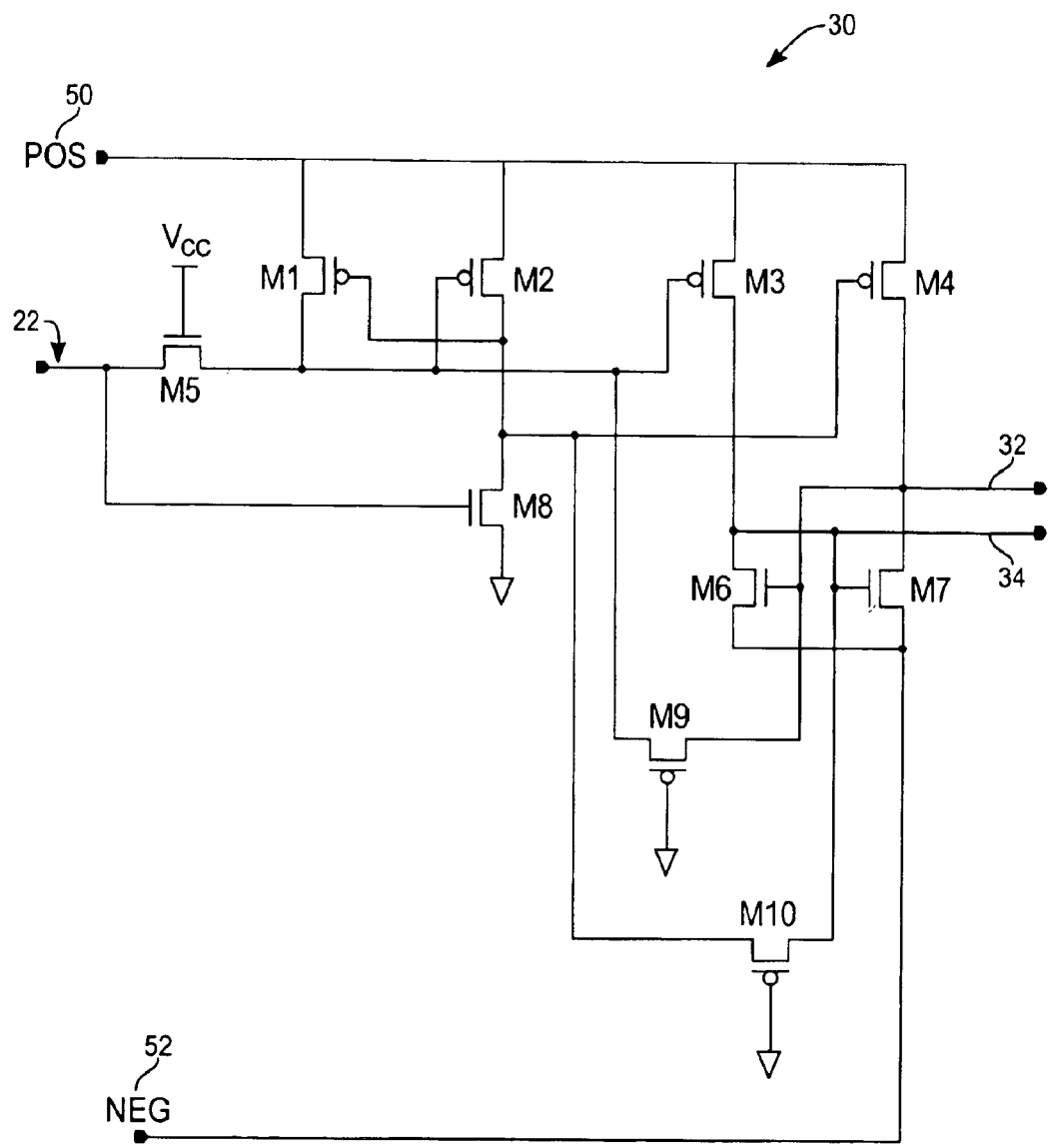
FIG. 3 is a circuit diagram of an embodiment of the wordline group switching means of the present invention shown in FIG. 2.

FIG. 3 shows an embodiment of the wordline group switching means 30 shown in FIG. 2. A POS terminal 50 that carries positive voltages connects to the drains of PMOS transistors M1, M2, M3, and M4. The drain of the transistor M1 connects to the gate of the transistor M2 and the source of an NMOS transistor M5. The gate of the transistor M5 connects to a power supply Vcc and the drain connects to the input terminal 22 of the wordline group switching means 30. The source of the transistor M5 further connects to the gate of the transistor M3. The drain of the transistor M3 connects to the second output terminal 34 of the wordline group switching means 30 and to the drain of an NMOS transistor M6. The drain of M4 connects to an NMOS transistor M7 and to the first output terminal 32 of the wordline group switching means 30. A NEG terminal 52 that carries negative voltages connects to sources of M6 and M7. The gate of M6 connects to the first output terminal 32 of the wordline group switching means 30 while the age of M7 connects to the second output terminal 34 of the wordline group switching means 30. A PMOS transistor M9 connects the gate of M6 to the gate M3 while another PMOS transistor M10 connects the gate of M7 to the gate of M4.

The circuit functions as follow: M1 and M2 functions as a high voltage pass gate pair that sends the high voltage at POS terminal 50 to either the gate of M3 or M4 depending on the logic signal at the input terminal 22. When a logic high input signal is presented at the input terminal 22, M1 is turned on, passing a high voltage at POS terminal to the gate of M3, turning M3 off. With M3 off, output terminal 32 is blocked off from the POS terminal. With a logic high signal at its gate, M8 is turned on. As a result, the gate of M4 is connected to ground, which turns on M4, thereby passing the positive voltage at POS terminal 50 onto the first output terminal 32. Since the gate of M6 is connected to the first output terminal 32, with a high voltage signal presented at the first output terminal 32, M6 is turned on, thereby connecting the negative voltages at NEG terminal 52 to the second output terminal 34. M7, with its gate connected to the second output terminal 34, is turned off by the negative voltages at the second output terminal 34, blocking the NEG terminal 52 from the first output terminal 32. Alternatively, when a logic low signal is presented at the input terminal 22, M2 is turned on while M1 will be turned off. As a result, the high voltage at POS terminal 50 would be connected to the gate of M4, thereby disconnecting the first output terminal 32 from the POS terminal 50. Also, M3 is turned on by the logic low signal, thereby connecting the high voltage at POS terminal 50 to the second output terminal 34. With a positive voltage at the second output terminal 34, M7 is turned on, thereby passing the negative voltages at NEG terminal 52 to the first output terminal 32. The negative voltages at the first output terminal 32 turns M6 off, thereby blocking the second output terminal 34 from the NEG terminal. M9 and M10 provide feedback loops from the first and second output terminals 32, 34 to the gates of M3 and M4 respectively to enhance the voltage latch performance at low Vcc condition.

Referring back to FIG. 1, a defective wordline decoder 60, a defective wordline erase registers block 62, a redundant wordline voltage modulator 64 and a plurality of redundant wordline pair 66 form a part of a circuit that replaces defective wordlines in the memory array 10 with redundant wordline pairs 66. During a pre-erase erase routine, each wordline is scanned for defective cells. If a wordline is found to be connected to a defective cell, the sector address (upper address) and group address (middle address) of the wordline is registered by a register in the defective wordline decoder 60 while the lower address, which indicates the location of the wordline in a group, is latched onto by a register in the defective wordline erase register block 62. Since wordline defects usually occur in pairs, if a wordline is found to be defective, the defective wordline and its corresponding wordline will be replaced by a redundant wordline pair. As a result, the defective wordline erase registers block 62 contains only half as many registers as there are wordlines in a group. During a erasure routine, when a defective x-address is identified by the defective wordline decoder 60, an assertive signal will be sent to the defective wordline erase registers block 62 through an input terminal 68 of the defective wordline erase register block 62. The wordline erase registers block 62, in turn, sends an assertive signal through one of the output terminals 70 to the wordline voltage modulator 20. An assertive signal at one of the output terminals 70 will cause the wordline voltage modulator 20 to block the erasure voltage from reaching the defective wordline pair.

In a subsequent step, a replacement redundant pair of wordline 66 is erased when an assertive signal is receive from an input terminal 72 of the redundant wordline voltage modulator 64. The redundant wordline voltage modulator 64 in turn sends a negative voltage through a redundant wordline driver 65 to the corresponding redundant wordline pair 66 for the proper erasure of the replacement wordline pair.

Figure 4:
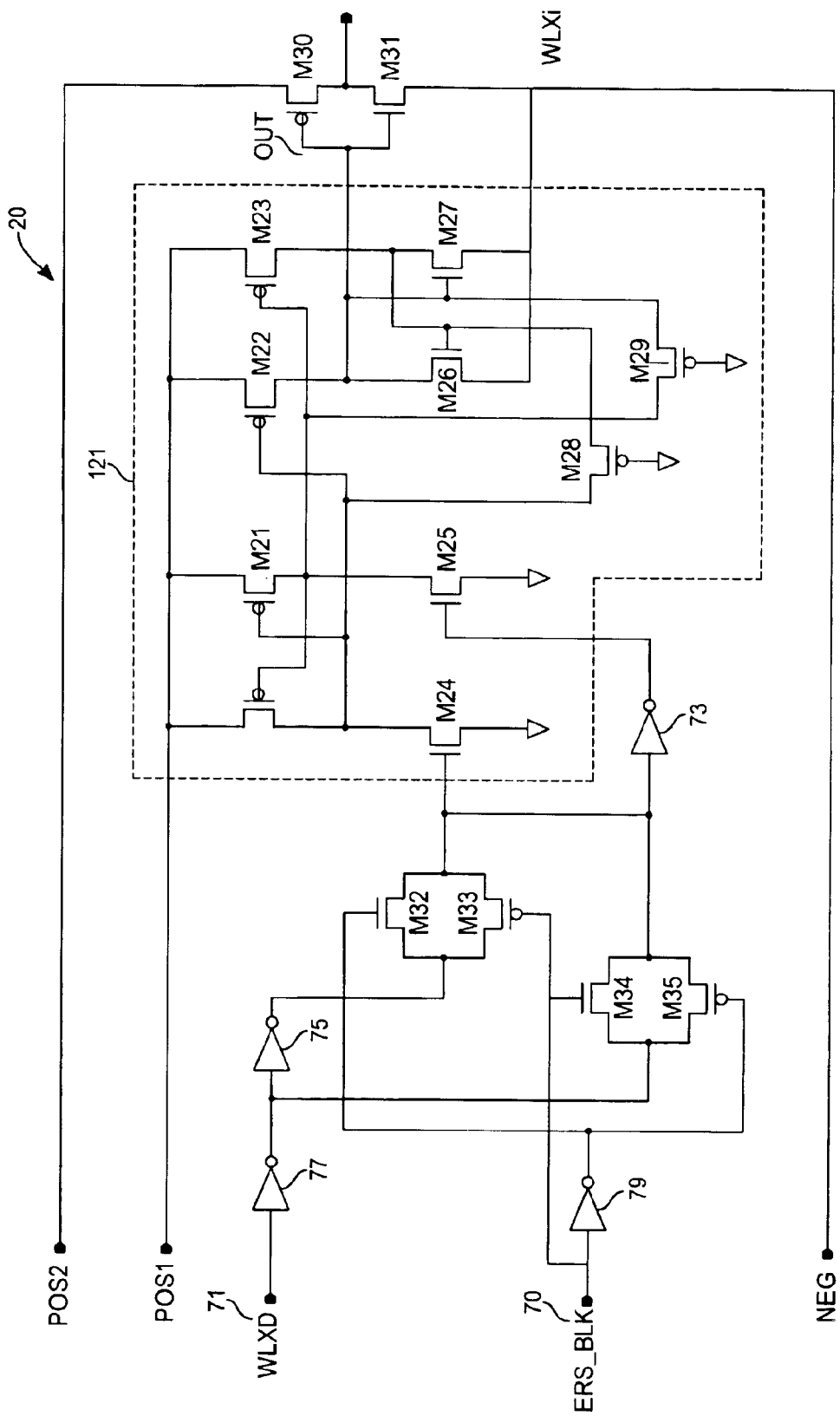
FIG. 4 is a circuit diagram of an embodiment of the wordline voltage modulator of the present invention shown in FIG. 1.

FIG. 4 shows an embodiment of the wordline voltage modulator 20 shown in FIG. 1. The circuit shown in FIG. 4 is responsible for sending a controlling voltage to a single wordline. The wordline voltage modulator has as many circuits shown in FIG. 4 as there are wordlines in a group. The high voltage switching circuit that is comprised of M20–M29, which is blocked-in and referred to by numeral 121 has the same connection and functions in the same way as M1–M10 in the wordline group switching means shown in FIG. 3. The Gate of M24 (IN) receives a voltage signal from WLXDi through a first pair of pass transistor pair M32, m33 and a first inverter 77 and a second inverter 75. The gate of M25 connects to WLXDi through the first inverter 77, a second pass transistor pair M34, M35 and a third inverter 73. The gate M32 connects to ERS_BLKi while the gate of M33 connects to ERS_BLKi through a fourth inverter 79. The gate of M34 connects to ERS_BLKi while the gate of M35 connects to ERS_BLKi through the fourth inverter 79.

The circuit functions as follow: Wordline driving lines WLXDi 71 represent the driver lines decoded from the lower x-address and is associated with every pair of wordlines in the group. During the erase operation, the WLXDi are all in logic 1 state. ERS_BLKi 70 carries a signal from the defective wordline erase register block 62. For a defective wordline pair, this signal is held low. M32 and M33 are select transistors that select the same state of WLXDi, which is logic 1. Transistors M34 and M35 select the opposite state, which is logic 0. For the defective pair, ERS_BLKi is high and M34 and M35 are now in the opposite state of WLXDi, which is logic 0 and it is passed to IN. The switch circuit 121 produces a negative voltage to OUT in the same manner as mention in the description of wordline group switching means 30 in FIG. 3. (OUT is equivalent to line 32 in FIG. 3.) Negative voltage at the gate of PMOS M30 effectively gates the voltage of POS2 that is 0V during the erase operation to line WLXDMVi 24. The defective wordline pair associated with this WLXDMV line is grounded. For the good pair, signal ERS_BLKi is in logic 1 state. It turns on transistors M32 and M33 and turns off M34 and M35. Now IN has the same state as WLXDi, which is high. The switch circuit 121 produces a positive voltage that is the same as POS1. This voltage effectively shuts off transistor M30 and turns on transistor M31 to pass the negative voltage to WLXDMVi 24. The wordline pair associated with this WLXDMVi line gets full negative voltage needed for erasure. All the transistors M26, M27, M31 connected to negative voltage line NEG are resided in an isolated P-well.

Figure 5:
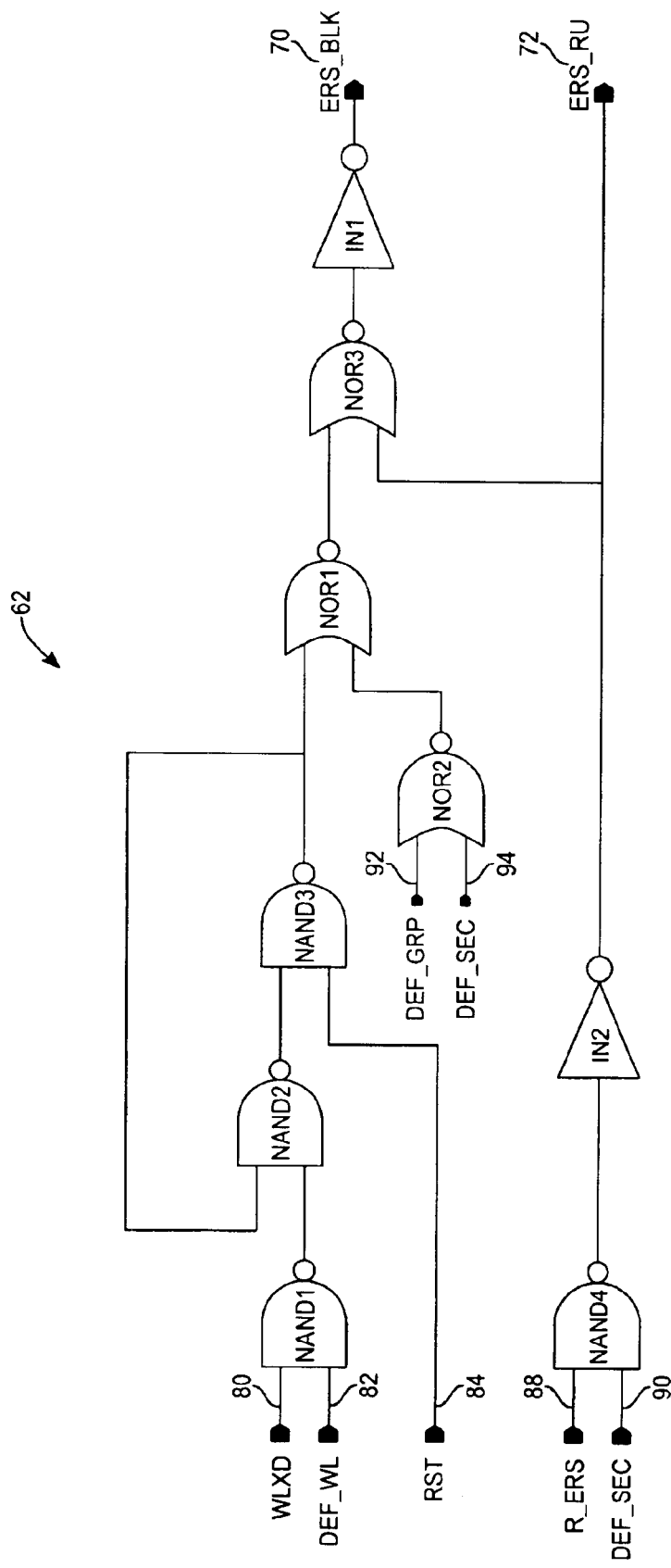
FIG. 5 is a circuit diagram of an embodiment of a defective wordline erase register found in the defective wordline erase registers block shown in FIG. 1.

FIG. 5 shows an embodiment of the defective wordline erase register found in the defective wordline erase registers block 62 shown in FIG. 1. Each one of the defective wordline erase register receives three input signals from the defective wordline decoder 60 shown in FIG. 1: a first input signal from a first input terminal DEF_WL 82, a second input signal from a second input terminal DEF_GRP 92, and a third input signal from a third input terminal DEF_SEC 94. The first input signal feeds into a first input terminal of a first NAND gate (NAND1) while a wordline driving signal at a WLXD terminal 80 feeds into a second input terminal of NAND1. An output terminal of the NAND1 feeds into an input terminal of a second NAND gate (NAND2). An output terminal of NAND2 feeds into a first input terminal of a third NAND gate (NAND3). An output terminal of NAND3 feeds into a second input terminal of NAND2 and to a first input terminal of a first NOR gate (NOR1). A RST input terminal 84 connects to a second input terminal of NAND3 while an output terminal of a second NOR gate (NOR2) connects to a second input of the NOR1. The NOR2 takes a first input signal from the DEF_GRP input terminal 92 and a second input signal from the DEF_SEC input terminal 94. An output terminal of NOR1 feeds input to a first input terminal of a NOR gate (NOR3). The output of the NOR3 connects to a first output terminal of the defective wordline erase register 62 through a first inverter (IN1). An output terminal of a fourth NAND gate (NAND4) connects to a second input terminal of NOR3 through a second inverter (IN2). A first input terminal of NAND4 connects to an input terminal (R_ERS) 88 that carries a redundant wordline erase signal. A second input terminal of NAND4 connects to the DEF_SEC input terminal 94. The output of the second inverter IN2 also connects to a second output terminal (ERS_RWL) 72 of the defective wordline erase register 62.

The defective wordline erase register work as follow: the NAND2 and NAND3 forms a latch that is set when the corresponding wordline pair is found to be defective during the pre-erase routine. During the erasure step, if a defective wordline is detected, the defective wordline decoder 60 (FIG. 1) will send an assertive signal to the DEF_WL terminal 82, the DEF_GRP terminal 92, and the DEF_SEC terminal 90. Along with an assertive logic signal at the WLXD terminal 80, NAND1 issues an assertive signal at its output. The assertive signal from NAND1 combines with the set latch NAND2, NAND3 to produce an assertive output at the first input of NOR1. Since the DEF_GRP terminal 92 and the DEF_SEC terminal 94 also carries an assertive signal, NOR2 also sends an assertive signal to the second input terminal of NOR1. As a result, the output of NOR1 issues an assertive signal. During the memory array erasure step, R_ERS terminal does not carry an assertive signal. As a result, the second input terminal of NOR3 receives an assertive signal as well. Consequently, the output at the ERS_BLK becomes assertive, which in turn blocks one of the wordline voltage modulator from issuing the negative erasure voltage to the defective wordline pair.

Since the DEF_WL signal is always low for a good pair of wordline, the latch is not set. However, since the same register is used for wordlines in other groups as well, the latch may have been set by a defective wordline in a prior group. Nevertheless, provided that the inputs at NOR2 is not assertive, i.e., the group address and the sector address does not match the defective wordline, NOR1 will not issue an assertive signal and ERS_BLK maintains a logic low output. When the sector with defective wordline pair is detected, the redundant wordline pair needs to be erased. R_ERS 88 will receive an assertive signal along with DEF_SEC 90. As a result, ERS_RWL 72 issues an assertive signal, which will cause the redundant wordline voltage modulator 64 to issue a negative voltage for the erasure of the redundant wordline 66.

What is claimed is:

1. A flash memory array with improved erasure performance comprising:

a plurality of sectors of floating gate memory cells, each said sector of floating gate memory cells including a plurality of groups of floating gate memory cells, each said group of floating gate memory cells including one or more wordlines of floating gate memory cells, said one or more wordlines each being coupled to a voltage selecting means, said voltage selecting means configured to be controlled by an address decoding means that is common to all wordlines in a group, erasure of said flash memory array being carried out by erasing said groups of floating gate memory cells individually.

2. The flash memory array of claim 1, wherein said voltage selecting means comprises of a first and second NMOS transistor connect in a serial manner, with the source of said first NMOS transistor connected to the drain of said second NMOS transistor to form a common node, the drain of said first transistor connected to a voltage supply line while the source of said second NMOS transistor being connected to ground, the gates of said first and second NMOS transistors being connected to a first and second output terminals of said address decoding means respectively, a wordline connects to said common node whereby a high voltage signal to the gate of said first NMOS transistor and a low voltage signal to the gate of said second NMOS transistor would connects said voltage supply line to said wordline.

3. The flash memory array of claim 2, wherein a low voltage to the gate of said first NMOS transistor and a high voltage to the gate of said second NMOS transistor would isolates said wordline from said voltage supply line.

4. The flash memory array of claim 1, wherein said voltage selecting means comprises of a first and second PMOS transistor connect in a serial manner, with the drain of said first PMOS transistor connected to the source of said second PMOS transistor to form a common node, the source of said first transistor connected to a voltage supply line while the drain of said second PMOS transistor being connected to ground, the gates of said first and second PMOS transistors being connected to a first and second output terminals of said address decoding means respectively, a wordline connects to said common node whereby a low voltage signal to the gate of said first PMOS transistor and a high voltage signal to the gate of said second PMOS transistor would connects said voltage supply line to said wordline.

5. The flash memory array of claim 4, wherein a high voltage to the gate of said first PMOS transistor and a low voltage to the gate of said second PMOS transistor would isolates said wordline from said voltage supply line.

6. A method of erasing a floating gate memory array that includes a plurality of sectors of floating gate memory cells, each said plurality of sectors includes a plurality of wordlines of floating gate memory cells, the method comprising:

organizing each of said plurality of sectors of floating gate memory cells into groups of wordlines, each group of wordlines having a common address decoding switch that will pass an erasure voltage to said group of wordlines only when a certain address is decoded; and isolating each said group of wordlines from a controlling voltage when a certain group of addresses is not decoded.

* * * * *